(12) United States Patent
Yeruva et al.

(10) Patent No.: US 11,081,460 B2
(45) Date of Patent: Aug. 3, 2021

(54) METHODS AND SYSTEMS FOR MANUFACTURING PILLAR STRUCTURES ON SEMICONDUCTOR DEVICES

(71) Applicant: Micron Technology, Inc., Boise, ID (US)

(72) Inventors: Suresh Yeruva, Boise, ID (US); Owen R. Fay, Meridian, ID (US); Sameer S. Vadhavkar, Boise, ID (US); Adriel Jebin Jacob Jebaraj, Boise, ID (US); Wayne H. Huang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/236,237

(22) Filed: Dec. 28, 2018

(65) Prior Publication Data

US 2020/0211993 A1     Jul. 2, 2020

(51) Int. Cl.
*H01L 23/00*     (2006.01)

(52) U.S. Cl.
CPC .............. *H01L 24/14* (2013.01); *H01L 24/11* (2013.01); *H01L 24/13* (2013.01); *H01L 2224/1146* (2013.01); *H01L 2224/11614* (2013.01); *H01L 2224/13083* (2013.01); *H01L 2224/13111* (2013.01); *H01L 2224/13139* (2013.01); *H01L 2224/13147* (2013.01); *H01L 2224/13155* (2013.01); *H01L 2224/14517* (2013.01); *H01L 2924/35121* (2013.01)

(58) Field of Classification Search
CPC ......... H01L 24/14; H01L 24/11; H01L 24/13; H01L 23/5283; H01L 24/17; H01L 24/09; H01L 24/81; H01L 23/3121; H01L 23/3128; H01L 23/49811

USPC ........ 257/737, 738, 692; 438/614, 107, 126, 438/612, 652

See application file for complete search history.

(56) References Cited

U.S. PATENT DOCUMENTS

2010/0013094 A1*  1/2010  Jo ........................... H01L 24/14
                                                                257/738
2010/0081269 A1*  4/2010  Makino ................... H01L 24/05
                                                                438/612

(Continued)

OTHER PUBLICATIONS

KR Patent Application No. 10-2019-0172796—Korean Office Action and Search Report, dated Mar. 16, 2021, with English Translation, 23 pages.

*Primary Examiner* — Mouloucoulaye Inoussa
(74) *Attorney, Agent, or Firm* — Perkins Coie LLP

(57) ABSTRACT

A method of manufacturing a semiconductor device having a conductive substrate having a first surface, a second surface opposite the first surface, and a passivation material covering a portion of the first surface can include applying a seed layer of conductive material to the first surface of the conductive substrate and to the passivation material, the seed layer having a first face opposite the conductive substrate. The method can include forming a plurality of pillars comprising layers of first and second materials. The method can include etching the seed layer to undercut the seed layer between the conductive substrate and the first material of at least one of the pillars. In some embodiments, a cross-sectional area of the seed layer in contact with the passivation material between the first material and the conductive substrate is less than the cross-sectional area of the second material.

22 Claims, 6 Drawing Sheets

(56) References Cited

U.S. PATENT DOCUMENTS

| | | |
|---|---|---|
| 2011/0101527 A1 | 5/2011 | Cheng et al. |
| 2012/0086123 A1* | 4/2012 | Park ........................ H01L 24/14 |
| | | 257/738 |
| 2013/0127048 A1* | 5/2013 | Hasegawa ............. H01L 21/561 |
| | | 257/737 |
| 2014/0167254 A1* | 6/2014 | Yu ........................... H01L 24/11 |
| | | 257/737 |
| 2017/0084558 A1* | 3/2017 | Seo ..................... H01L 23/3171 |

\* cited by examiner

METHODS AND SYSTEMS FOR MANUFACTURING PILLAR STRUCTURES ON SEMICONDUCTOR DEVICES

TECHNICAL FIELD

The present technology generally relates to semiconductor devices, and in some embodiments more particularly to mechanical pillar structures for die-to-die, die-to-substrate, and/or package-to-package interconnects.

BACKGROUND

Microelectronic devices, such as memory devices, microprocessors, and light emitting diodes, typically include one or more semiconductor die mounted to a substrate. Semiconductor die can include functional features, such as memory cells, processor circuits, and interconnecting circuitry. Semiconductor die also typically include bond pads and pillar structures electrically coupled to the functional features. The bond pads can be electrically coupled to pins or other types of terminals for connecting the semiconductor die to busses, circuits, or other assemblies.

In addition to pillar structures coupled to functional features (e.g., live pillars), semiconductor die can include pillar structures which provide mechanical support to the semiconductor package without electrically coupling to functional features. These mechanical pillars, while not providing electrical connection to functional features of the semiconductor die, can provide mechanical support, thermal transfer, and various other functional and structural benefits. Mechanical failure of conventional mechanical pillars, however, can cause damage to important components (e.g., functional features, live circuitry, etc.) of a semiconductor device.

BRIEF DESCRIPTION OF THE DRAWINGS

Many aspects of the present technology can be better understood with reference to the following drawings. The components in the drawings are not necessarily to scale. Instead, emphasis is placed on illustrating clearly the principles of the present technology.

DETAILED DESCRIPTION

Figure 1:
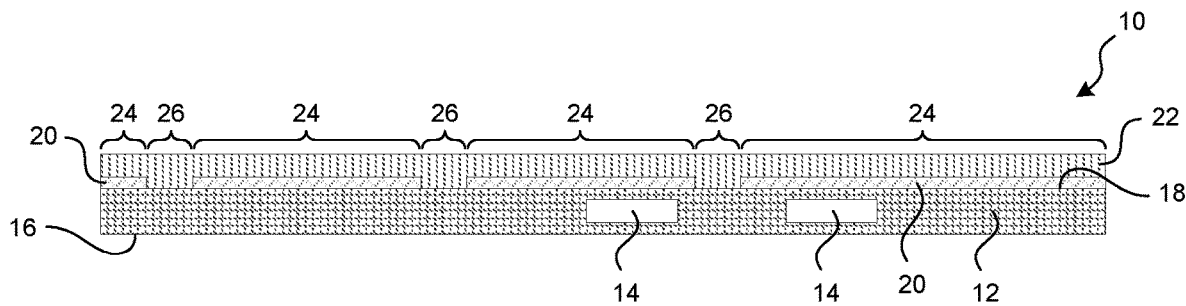
FIG. 1 is a cross-sectional view of a semiconductor device showing a substrate, a passivation material, and a seed layer in accordance with the present technology.

Specific details of several embodiments of semiconductor devices having mechanical pillars without an electrical function (e.g., "dummy" pillars) and live pillars with an electrical function and associated systems and methods, are described below. The term "semiconductor device" generally refers to a solid-state device that includes one or more semiconductor materials. Examples of semiconductor devices include logic devices, memory devices, microprocessors, and diodes among others. Furthermore, the term "semiconductor device" can refer to a finished device or to an assembly or other structure at various stages of processing before becoming a finished device. Depending upon the context in which it is used, the term "substrate" can refer to a wafer-level substrate or to a singulated, die-level substrate. A person having ordinary skill in the relevant art will recognize that suitable steps of the methods described herein can be performed at the wafer level or at the die level. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, spin coating, and/or other suitable techniques. Similarly, materials can be removed, for example, using plasma etching, wet etching, chemical-mechanical planarization, or other suitable techniques.

Many embodiments of the present technology are described below in the context of pillar structures that are coupled to substrates and passivation materials of a semiconductor device. A person having ordinary skill in the relevant art will also understand that the present technology may have embodiments for forming pillar structures on either the first side or the second side of a substrate assembly, and the pillar structures may be used in the context of other electrical connectors associated with a semiconductor assembly. The present technology may accordingly be practiced without several of the details of the embodiments described herein with reference to FIGS. 1-10. For ease of reference, identical reference numbers are used to identify similar or analogous components or features throughout this disclosure, but the use of the same reference number does not imply that the features should be construed to be identical. Indeed, in many examples described herein, identically numbered features have a plurality of embodiments that are distinct in structure and/or function from each other. Furthermore, the same shading may be used to indicate materials in cross section that can be compositionally similar, but the use of the same shading does not imply that the materials should be construed to be identical unless specifically noted herein.

Several embodiments of the present technology have weakened mechanical or dummy support pillars configured to mechanically break or fail without damaging adjacent substrates or other structures. More specifically, pillars connected to passivation materials are mechanically weakened to reduce damage to the passivation materials (e.g., reduce or eliminate damage to structures underlying the passivation materials) upon mechanical failure of the pillars. More specifically, shear forces or other forces during manufacture, packaging, shipment, and/or other processes often damage important structures. Live pillars having active electrical structure are configured to withstand greater shearing forces than the weakened mechanical pillars such that the mechanical pillars protect the live pillars. Moreover, the mechanical pillars are configured to fail without damaging adjacent structures, and, even after failure (e.g., delamination), the weakened mechanical pillars can be configured to provide an underfill capillary action, thermal transport, and/or compressive stress loading.

FIG. 1 illustrates a semiconductor device 10 at a stage of the manufacturing process. The device 10 includes a substrate 12, and the substrate 12 can include integrated circuitry 14 and/or other electrical components. The substrate 12 can be generally planar. As illustrated, the substrate 12 can include a first surface 16 and a second surface 18 opposite the first surface 16. The device 10 at this stage has one or more regions, layers and/or segments of passivation material 20 on the second surface 18 of the substrate 12 and a seed layer 22. The passivation materials 20 can be, for example, oxide layers, dielectric materials, and/or other materials configured to electrically and/or mechanically isolate portions of the substrate 12 from the surrounding environment.

As illustrated, the seed layer 22 can be on the passivation material 20 and second surface 18 of the substrate 12. The seed layer 22 can include first areas 24 associated with the location of the passivation material 20 and second areas 26 wherein no passivation material is present. In several embodiments, the seed layer 22 includes a barrier material and a seed material on the barrier material. The barrier material can be tantalum, tantalum nitride, titanium, titanium-tungsten or another material that inhibits or prevents diffusion of the pillar materials into the passivation material 20 and the substrate 12. The seed material can be copper, a copper alloy, nickel, or other suitable materials for plating a conductive material onto the seed material using electroplating or electroless-plating techniques known in the art.

Figure 2:
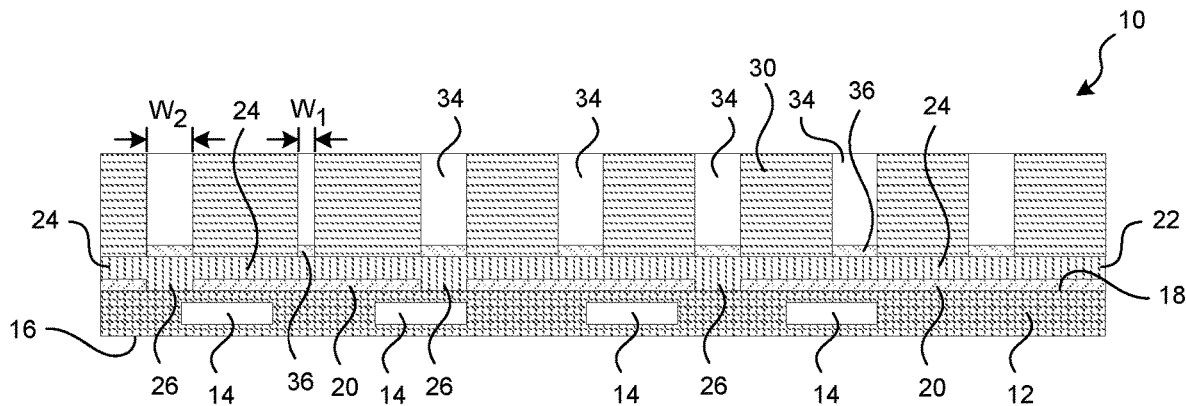
FIG. 2 is a cross-sectional view of the semiconductor device of FIG. 1 having a mask structure formed on the seed layer and a first material deposited in the through holes of the mask structure.

FIG. 2 shows the device 10 after a mask structure 30 has been formed on the seed layer 22. The mask structure 30 can include one or more apertures or through holes 34 aligned with the first and second areas 24, 26 of the seed layer 22. The through holes 34 aligned with the first areas 24 of the seed layer 22 are for forming mechanical/dummy pillars. Whereas the through holes 34 positioned over the second areas 26 of the seed layer 22 are for forming live pillars that are in direct contact with electrical components of the substrate 12. Mechanical/dummy pillars, when formed, are not in electrical contact with the substrate 12. Instead, the mechanical/dummy pillars contact the passivation material 20. The through holes 34 can all have the same width. In some embodiments, the through holes 34 aligned with the first areas 24 have a first width W1, and the through holes 34 aligned with the second areas have a second width W2 greater than the first width W1.

The live and mechanical (e.g., dummy) pillars can be formed by plating a first material 36 onto the seed layer 22 within the through holes 34. In some embodiments, the first material 36 is deposited onto the seed layer 22 using vapor deposition processes or other deposition techniques. In some embodiments, the first material 36 is deposited onto the seed layer 22 using electrochemical deposition. The first material 36 can comprise nickel or other suitable materials for adhering to the seed layer 22. In some embodiments, a layer of copper is plated onto the seed layer 22 and the first layer 36 is plated onto the layer of copper.

Figure 3:
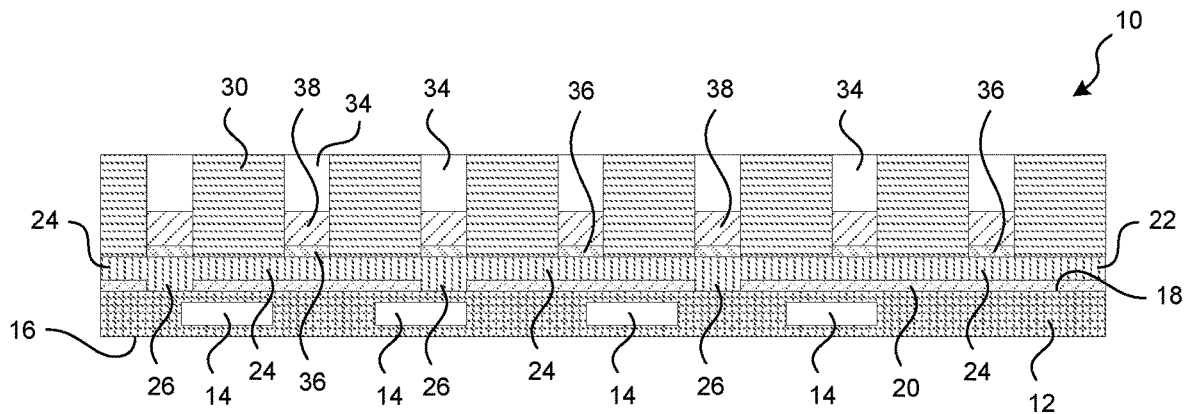
FIG. 3 is a cross-sectional view of the assembly of FIG. 2 with a second material added to the through holes of the mask structure.

FIG. 3 shows the device 10 after a second material 38 has been deposited onto the first material 36 within the through holes 34 of the mask structure 30. In some embodiments, the second material 38 is deposited directly onto the seed layer 22 instead of using the first material 36. The second material 38 can comprise tin-silver or other suitable materials. Combined, the seed layer 22, first material 36, and second material 38 can define pillars. Before etching the seed layer 22, each of the pillars can be electrically connected to each other via the continuous seed layer 22.

Figure 4:
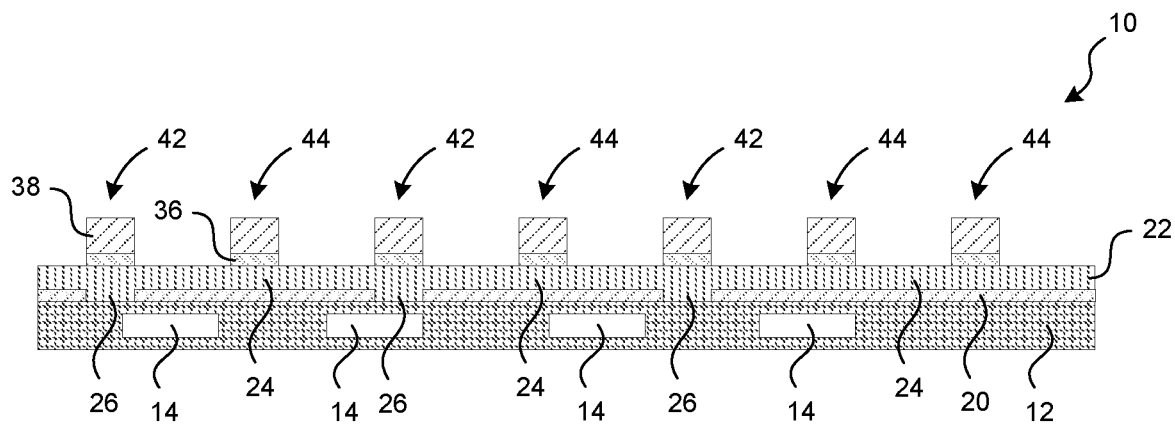
FIG. 4 is a cross-sectional view of the assembly of FIG. 3 with the mask structure removed.

FIG. 4 shows the live pillars 42 and the mechanical pillars 44 of the semiconductor device 10 after the mask structure 30 has been removed. Without the mask structure 30, the seed layer 22, and particularly the first and second areas 24, 26 of the seed layer 22, is exposed. Removing the mask structure 30 also reveals the first and second materials 36, 38 of the pillars 42, 44. The exposed portion of the seed layer 22 extends in the horizontal direction (e.g., in a plane parallel to the seed layer 22) between the stacks of the first and second materials 36, 38.

Figure 5:
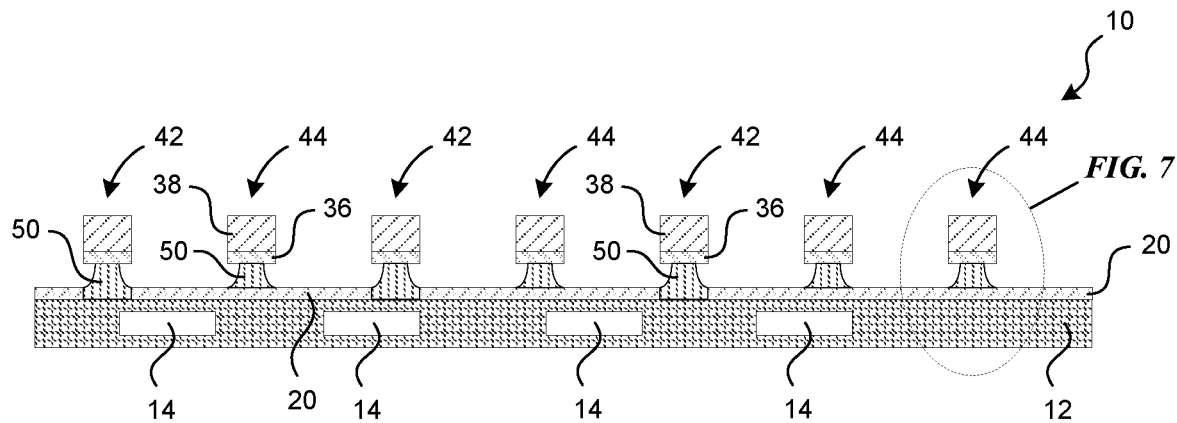
FIG. 5 is a cross-sectional view of the assembly of FIG. 4 wherein the seed layer is etched.
Figure 6:
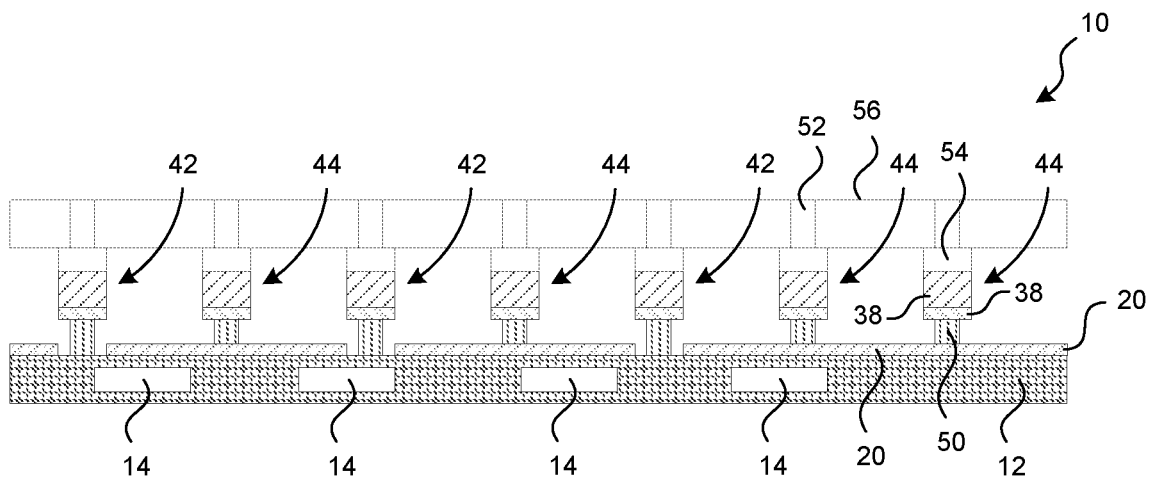
FIG. 6 is a cross-sectional view of the assembly of FIG. 5 wherein a semiconductor is shown in phantom connected to the pillars of the assembly of FIG. 5.

FIGS. 5-6 show the device 10 after the exposed portion of the seed layer 22 has been removed from the semiconductor device 10 to form base portions 50 of the pillars 42 and 44. For example, the exposed portion of the seed layer 22 can be removed using a wet etch suitable for removing the materials of the seed layer 22. Other removing/etching methods or devices may be used to remove the exposed portion of the seed layer 22.

In some embodiments, when forming the base portions 50, removal of the exposed portion of the seed layer 22 undercuts the seed layer 22 beneath the first material 36 (e.g., the seed layer material between the first material 36 and the substrate 12) in some or all of the pillars 42, 44. Undercutting the seed layer 22 under the mechanical pillars 44 narrow the base portions 50 and thereby weakens the connection between the mechanical pillars 44 and the passivation material 20.

As illustrated in FIG. 6, some or all of the pillars 42, 44 can be configured to connect to through-silicon vias 52, conductive pillars 54, or other portions of dies 56 positioned adjacent the substrate device 10. While the illustrated embodiment includes a die 56 positioned above the substrate device 10, the orientation of the substrate device 10 may be reversed such that the pillars 42, 44 extend downward and the adjacent die 56, package, or second substrate device 10 can be positioned below the substrate device 10.

Figure 7:
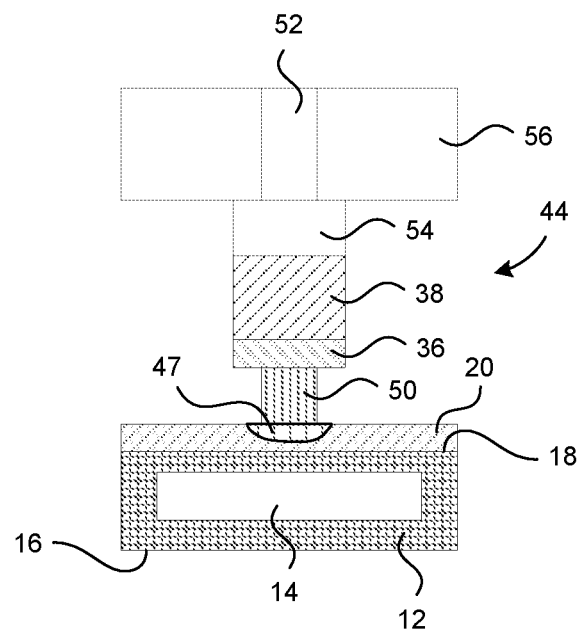
FIG. 7 is a closeup cross-sectional view of a mechanical pillar according to the present technology that has failed due to an applied stress.
Figure 8:
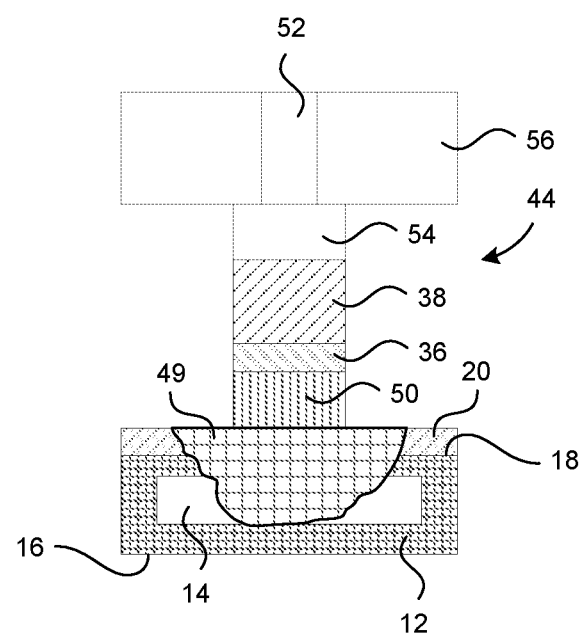
FIG. 8 is a closeup cross-sectional view of a prior art mechanical pillar that has failed due to an applied stress.

FIG. 7 is a detailed cross-sectional view of a single mechanical pillar in accordance with the present technology, and FIG. 8 is a detailed cross-sectional view of a conventional pillar. These figures show the weakening the connection between the mechanical pillars 44 and the passivation material 20 (e.g., by undercutting the seed layer 22) can reduce the damage to the passivation material 20 in the event of mechanical failure of the mechanical pillars 44. For example, referring to FIG. 7, failure of a weakened mechanical pillar 44 is limited to a small break 47 or other disruption of the passivation material 20. In some embodiments, the undercutting of the mechanical pillar 44 reduces or eliminates the risk that the break 47 extends through the passivation material 20 to the underlying substrate 12. Limiting breaks to the passivation material 20 can reduce or eliminate the risk of damage to the underlying active circuitry 14 and other components of the substrate 12. On the other hand, referring to FIG. 8, in the absence of undercutting failure of the mechanical pillars 44 can result in a break 49 that extends into the substrate 12. Such breaks 49 can result in damage to active components of the substrate 12 and may lead to failure of the entire semiconductor device.

In some embodiments, the mechanical pillars 44 are specifically designed to fail before the live pillars 42. For example, given equal cross-sections of the seed portions 50 of each pillar, the live pillars 42 preferably have a stronger attachment to the substrate 12 than the attachment between the mechanical pillars 44 and the passivation material 20. In some embodiments, a cross-sectional area of the base portions 50 of the mechanical pillars 44 is less than ¾, less than ⅗, less than ½, less than ⅓, less than ¼, and/or less than ⅕ of the cross-sectional area of the first material 36 of the mechanical pillars 44, as measured parallel to the second surface 18 of the substrate 12. In some embodiments, the mechanical pillars 44 can be weakened to a point where failure of the mechanical pillars 44 is likely or inevitable during manufacturing and/or handling of the semiconductor device 10. As used herein, "failure" of a mechanical pillar 44 refers to delamination or separation of the mechanical pillar 44 from the passivation material 20, as illustrated in FIG. 7, and/or as breakage of the base portions 50 of the mechanical pillars 44. After failure, a mechanical pillar 44 can be configured to perform support functions for the semiconductor device 10. For example, even after failure the mechanical pillars 44 (e.g., even after failure) can be configured to provide an underfill capillary action, thermal transport, and/or compressive stress loading for the semiconductor device 10.

The mechanical pillars 44 can also be narrower than the live pillars 42 such that the mechanical pillars 44 fail before the live pillars 42. For example, referring to FIG. 2, the mechanical pillars 44 can be formed in through hole 34 having a first width W1, whereas live pillars 42 can be formed in through holes 34 having a second width W2 greater than the first width W1. Such narrower mechanical pillars 44 are expected to fail before wider live pillars 42.

Figure 9:
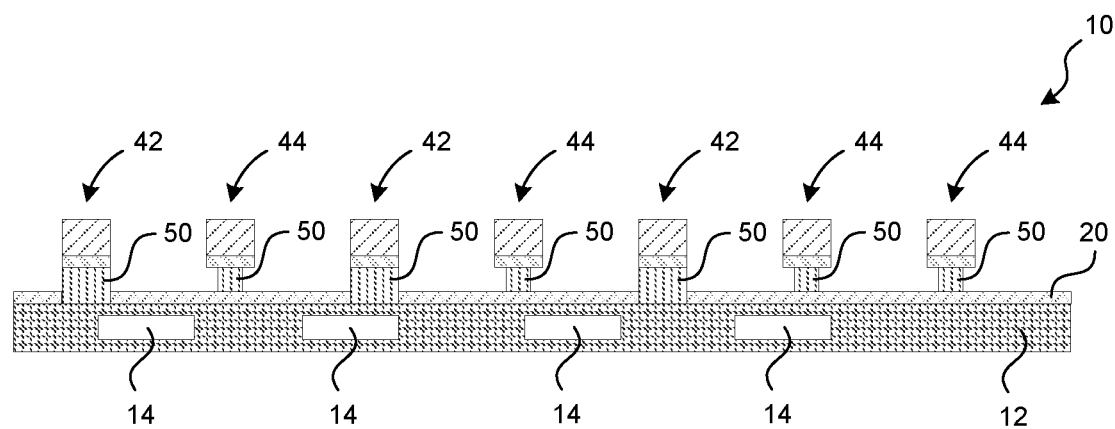
FIG. 9 is a block diagram illustrating a system that incorporates a semiconductor device in accordance with an embodiment of the present technology.

FIG. 9 illustrates an embodiment wherein the mechanical pillars 44 are undercut, while the live pillars 42 are left without undercut or less undercut than the mechanical pillars 44. Such selective undercutting can be achieved, for example, through use of localized mask structures, selective protective coating positioned around the live pillars 42, and/or other structures or methods configured to limit or prevent undercutting of the live pillars 42. Undercutting the mechanical pillars 44 while avoiding or limiting undercuts to the live pillars 42 can increase the respective difference in mechanical strength between the mechanical pillars 44 and the live pillars 42 as compared with the embodiments of FIGS. 5-6.

Figure 10:
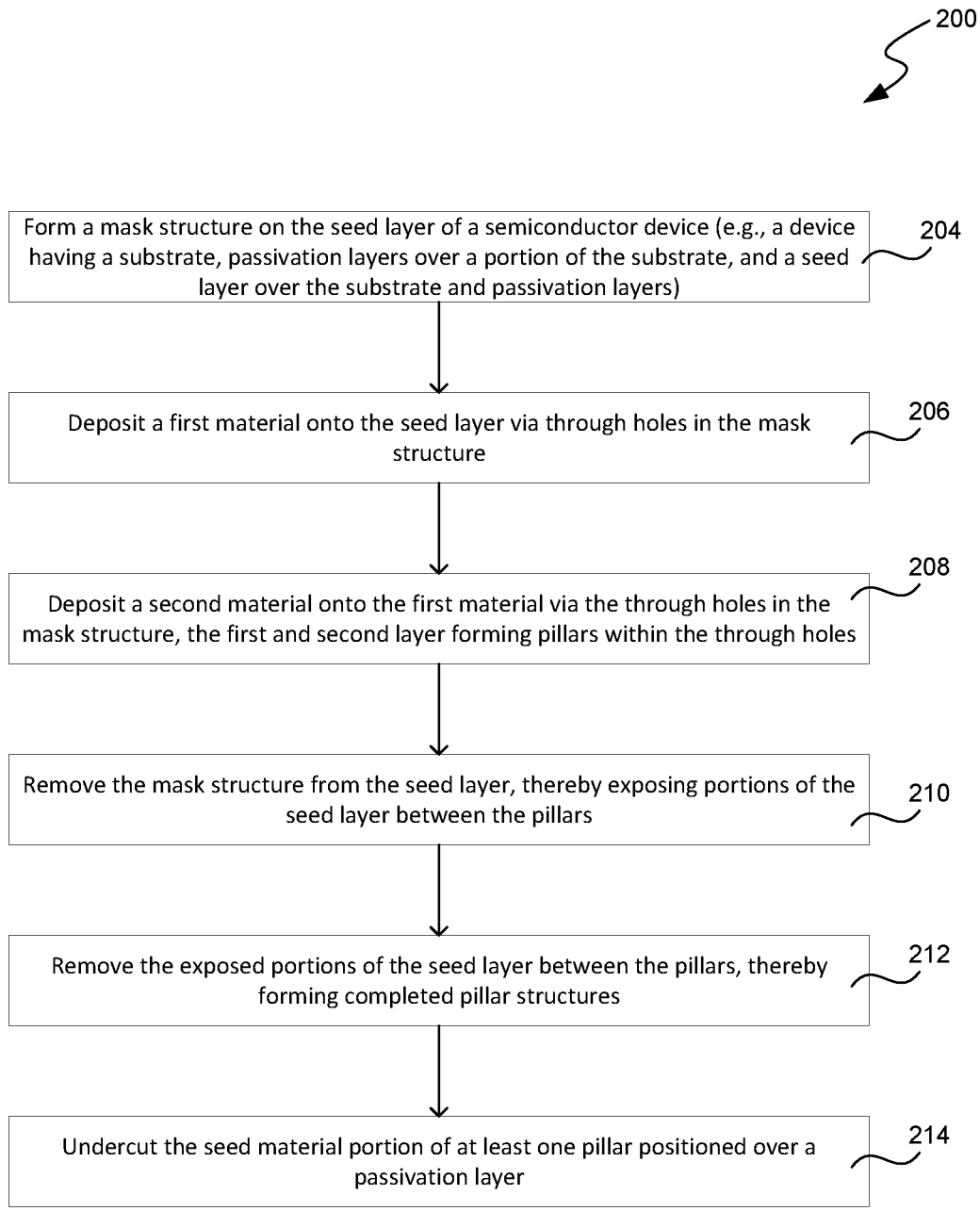
FIG. 10 is a flowchart illustrating a method for forming pillars on a semiconductor device.

FIG. 10 is a flow chart of an embodiment of a method 200 for forming pillars on a semiconductor device in accordance with an embodiment of the present technology. The method can include forming a mask on the seed layer (block 204) and plating a first material onto the exposed areas of the seed layer (block 206). The mask, for example, has openings that expose areas of the seed structure. The method 200 further includes depositing a second material into the openings over the first material thereby forming a pillar (block 208). The second material may be different than the first material. The method 200 further includes removing at least a portion of the mask and thereby exposing portions of the seed layer between the pillars (block 210). The method 200 continues by removing the exposed portions of the seed layer between the pillars by, for example, wet etching the seed structure and thereby forming pillars on the semiconductor device (block 212). The method can include undercutting the seed layer portion of one or more of the pillars formed in previous steps of the method 200 (block 214).

Figure 11:
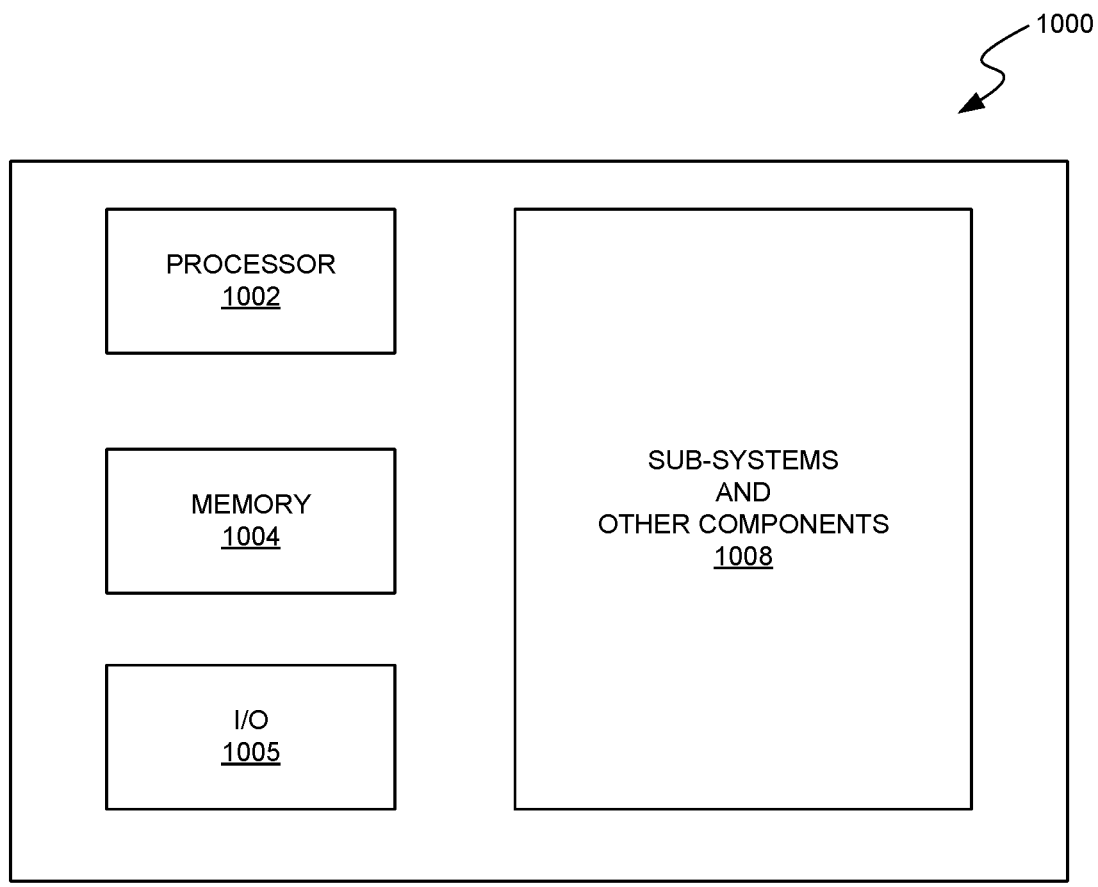
FIG. 11 is a schematic view of a semiconductor device system.

Any one of the semiconductor devices having the features described above (e.g., with reference to FIGS. 1-7 and 9) can be incorporated into any of a myriad of larger and/or more complex systems, a representative example of which is system 1000 shown schematically in FIG. 11. The system 1000 can include a processor 1002, a memory 1004 (e.g., SRAM, DRAM, flash, and/or other memory devices), input/output devices 1005, and/or other subsystems or components 1008. The semiconductor dies and semiconductor die assemblies described above can be included in any of the elements shown in FIG. 11. The resulting system 1000 can be configured to perform any of a wide variety of suitable computing, processing, storage, sensing, imaging, and/or other functions. Accordingly, representative examples of the system 1000 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 1000 include lights, cameras, vehicles, etc. With regard to these and other examples, the system 1000 can be housed in a single unit or distributed over multiple interconnected units, e.g., through a communication network. The components of the system 1000 can accordingly include local and/or remote memory storage devices and any of a wide variety of suitable computer-readable media.

The above detailed descriptions of embodiments of the technology are not intended to be exhaustive or to limit the technology to the precise form disclosed above. Although specific embodiments of, and examples for, the technology are described above for illustrative purposes, various equivalent modifications are possible within the scope of the technology, as those skilled in the relevant art will recognize. For example, while steps are presented in a given order, alternative embodiments may perform steps in a different order. Moreover, the various embodiments described herein may also be combined to provide further embodiments. Reference herein to "one embodiment," "an embodiment," or similar formulations means that a particular feature, structure, operation, or characteristic described in connection with the embodiment can be included in at least one embodiment of the present technology. Thus, the appearances of such phrases or formulations herein are not necessarily all referring to the same embodiment.

Certain aspects of the present technology may take the form of computer-executable instructions, including routines executed by a controller or other data processor. In some embodiments, a controller or other data processor is specifically programmed, configured, and/or constructed to perform one or more of these computer-executable instructions. Furthermore, some aspects of the present technology may take the form of data (e.g., non-transitory data) stored or distributed on computer-readable media, including magnetic or optically readable and/or removable computer discs as well as media distributed electronically over networks. Accordingly, data structures and transmissions of data particular to aspects of the present technology are encompassed within the scope of the present technology. The present technology also encompasses methods of both programming computer-readable media to perform particular steps and executing the steps.

Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Where the context permits, singular or plural terms may also include the plural or singular term, respectively. Additionally, the term "comprising" is used throughout to mean including at least the recited feature(s) such that any greater number of the same feature and/or additional types of other features are not precluded. Directional terms, such as "upper," "lower," "front," "back," "vertical," and "horizontal," may be used herein to express and clarify the relationship between various elements. It should be understood that such terms do not denote absolute orientation. Further, while advantages associated with certain embodiments of the technology have been described in the context of those embodiments, other embodiments may also exhibit such advantages, and not all embodiments need necessarily exhibit such advantages to fall within the scope of the technology. Accordingly, the disclosure and associated technology can encompass other embodiments not expressly shown or described herein.

We claim:

1. A method of manufacturing a semiconductor device, the semiconductor device having a conductive substrate having a first surface, a second surface opposite the first surface, and a passivation material covering a portion of the first surface, the method comprising:
applying a seed layer of conductive material to the first surface of the conductive substrate and to the passivation material, the seed layer having a first face opposite the conductive substrate;
forming a plurality of pillars, wherein one or more of the pillars are positioned entirely over a portion of the passivation material, wherein forming the plurality of pillars comprises:
depositing a first material onto a portion of the seed layer, and
depositing a second material onto the first material; and
etching the seed layer to remove the conductive material from the passivation material between the plurality of pillars and to undercut the seed layer between the conductive substrate and the first material of at least one of the pillars;
wherein a cross-sectional area of the seed layer of the one or more pillars positioned entirely over a portion of the passivation material, as measured parallel to the first surface of the conductive substrate, is less than the cross-sectional area of the first material as measured parallel to the first surface of the conductive substrate.

2. The method of claim 1, further comprising forming a mask structure on the seed layer, the mask structure having a plurality of through holes, wherein the plurality of pillars are formed in the plurality of through holes of the mask structure.

3. The method of claim 2, comprising removing the mask structure from the seed layer prior to etching the seed layer.

4. The method of claim 2, wherein the plurality of through holes comprise a first through hole having a first width as measured parallel to the first surface of the conductive substrate and a second through hole having a second width greater than the first width.

5. The method of claim 4, wherein the first through hole is positioned over a portion of the passivation material and the second through hole is positioned over a portion of the conductive substrate not covered by the passivation material.

6. The method of claim 1, wherein the cross-sectional area of the seed layer in contact with the passivation material between the first material and the conductive substrate, as measured parallel to the first surface of the conductive substrate, is less than or equal to ½ of the cross-sectional area of the second material as measured parallel to the first surface of the conductive substrate.

7. The method of claim 1, wherein the cross-sectional area of the seed layer in contact with the passivation material between the first material and the conductive substrate, as measured parallel to the first surface of the conductive substrate, is less than or equal to ¼ of the cross-sectional area of the second material as measured parallel to the first surface of the conductive substrate.

8. The method of claim 1, wherein the seed layer comprises copper.

9. The method of claim 1, wherein the first material comprises nickel.

10. The method of claim 1, wherein the second material comprises tin-silver.

11. A method of manufacturing a semiconductor device, the semiconductor device having a conductive substrate having a first surface partially covered by a passivation material and a second surface opposite the first surface, the method comprising:
covering at least a portion of the first surface and the passivation material with a layer of conductive material, the layer of conductive material having a first side opposite the conductive substrate;
depositing a first material onto the layer of conductive material thereby forming bases for a first pillar and a second pillar;
depositing a second material onto the first material;
removing the layer of conductive material from portions of the passivation material and the first surface of the conductive substrate outside of the first and second pillars; and
undercutting the layer of conductive material between the layer of first material of the first pillar and the conductive substrate;
wherein the first pillar is positioned over a portion of the conductive substrate completely covered by the passivation material.

12. The method of claim 11, further comprising undercutting the layer of conductive material between the layer of first material of the second pillar and the conductive substrate, wherein the second pillar is positioned over a portion of the conductive substrate not covered by the passivation material.

13. The method of claim 11, further comprising forming a mask structure on the layer of conductive material, wherein the first material is deposited onto the layer of conductive material within through holes of the mask structure.

14. The method of claim 11, wherein the first material is nickel.

15. The method of claim 14, wherein the second material comprises tin-silver.

16. The method of claim 11, wherein first pillar has a first width and the second pillar has a second width greater than the first width, wherein the second pillar is positioned over a portion of the conductive substrate not covered by the passivation material.

17. A method of manufacturing a semiconductor device, the method comprising:

forming a mask on a seed structure, wherein the mask has a first set of openings that expose areas of the seed structure that are electrically coupled to live circuitry on a side of the seed structure opposite the mask, and wherein the mask has a second set of openings that expose areas of the seed structure that are entirely in direct contact with a passivation material positioned between the seed structure and the live circuitry;

plating a first material onto the exposed areas of the seed structure;

depositing a second material into the openings over the first material, thereby forming a first set of pillars within the first set of opening and a second set of pillar within the second set of openings, wherein the second material is different from the first material;

removing at least a portion of the mask to expose portions of the seed structure between the pillars;

removing the exposed portions of the seed structure between the pillars; and undercutting the seed structure on a side of the first material of the second set of pillars opposite the second material of the second set of pillars.

18. The method of claim 17, wherein the first material comprises nickel and the second material comprises tin-silver.

19. The method of claim 17, further comprising connecting the second material to a conductive pillar of a through-substrate via of a semiconductor die.

20. The method of claim 17, further comprising undercutting the seed structure on a side of the first material of the first set of pillars opposite the second material of the first set of pillars.

21. The method of claim 17 wherein the seed structure on the side of the first material of the second set of pillars opposite the second material of the second set of pillars has a cross-sectional area less than $\frac{1}{3}$ of a cross-sectional area of the first material of the second set of pillars.

22. The method of claim 17, wherein the first set of openings include a first opening having a first width and the second set of openings include a second opening having a second width less than the first width.

* * * * *